United States Patent [19]

Masselin

[11] 4,399,501

[45] Aug. 16, 1983

[54] SET OF POWER SEMICONDUCTORS EQUIPPED WITH FIRING TRANSFORMERS AND WITH PROTECTION CIRCUITS

[75] Inventor: Michel Masselin, Velizy-Villacoublay, France

[73] Assignee: Alsthom-Atlantique, Paris, France

[21] Appl. No.: 255,079

[22] Filed: Apr. 17, 1981

[30] Foreign Application Priority Data

Apr. 21, 1980 [FR] France ................................ 80 08865

[51] Int. Cl.³ ................................................ H05K 7/20

[52] U.S. Cl. ...................................... 363/141; 361/385

[58] Field of Search ............... 361/382, 385, 399, 412, 361/415; 363/141, 144, 146; 174/15 R; 165/104.33

[56] References Cited

U.S. PATENT DOCUMENTS 3,445,747 5/1969 Laurent ................................ 363/141
3,792,338 2/1974 Barthelemy ......................... 361/385
3,858,090 12/1974 Lehmann ............................ 361/385

FOREIGN PATENT DOCUMENTS 2399781 3/1979 France .
2413847 7/1979 France .

*Primary Examiner*—G. P. Tolin
*Attorney, Agent, or Firm*—Sughrue, Mion, Zinn, Macpeak & Seas

[57] ABSTRACT

A set of power semiconductors equipped with firing transformers and with protection circuits. Circuitry is disposed in such a way that the connections between the thyristor (2,3), the transformers (11) and the protection circuits (9,10) are shortened. To do this, the components (9, 10, 11) are disposed on circuit boards (7,8) whose planes are parallel to the axes of the columns (2,3) of thyristors. Applications to energizing railway traction motors.

1 Claim, 2 Drawing Figures

1
2
4
5
6
7
8
9
10
11
12
13
14

SET OF POWER SEMICONDUCTORS EQUIPPED WITH FIRING TRANSFORMERS AND WITH PROTECTION CIRCUITS

The present invention relates to a set of power semiconductors equipped with firing transformers and with protection circuits, said semiconductors being disposed in columns immersed in a cooling fluid such as a fluorinated hydrocarbon.

BACKGROUND OF THE INVENTION

Often, columns of power thyristors and of power diodes are installed between two end plates, the assembly thus formed being fixed in a sealed chamber which contains a fluorinated hydrocarbon. These power semiconductors are used for example to control traction motors in the field of railway technology. The pulse transformers and resistor-capacitor circuits serve respectively to fire and to protect the power semiconductors. In general, the pulse transformers and protection circuits are disposed behind one of the plates at the bases of the columns and in the axes of the columns of semiconductors. It follows that the connections between the pulse transformers and the triggers of the thyristors are excessively long and result in electrical interference. Indeed, the connections for some of the thyristors disposed on the side furthest from the transformers have to run right along the column of semi-conductors.

Preferred embodiments of the support device in accordance with the present invention remedy this drawback. The transformers are disposed in such a way that the connections are shorter than in devices of the prior art.

SUMMARY OF THE INVENTION

The present invention provides a set of power semiconductors equipped with firing transformers and with protection circuits, the semiconductors being disposed in columns immersed in a cooling fluid. The columns are installed between end plates. The transformers and the circuits for protecting the resistors and the capacitors are disposed on supports. The connections are in the form of printed circuits on said support. The printed circuits on their supports are disposed in at least one plane parallel to the axes of said columns.

According to one feature of a preferred embodiment of the invention the level of the cooling fluid is such that said transformers and said capacitors are not immersed in said cooling fluid in the liquid state.

According to another feature of this embodiment, said printed circuits and/or support circuits are made integral with said end plates by means of tie rods each of which is fitted into the end surface of one of said plates.

BRIEF DESCRIPTION OF THE DRAWINGS

A preferred embodiment of the present invention is described hereinafter with reference to the accompanying drawings in which.

DETAILED DESCRIPTION

Figure 1:
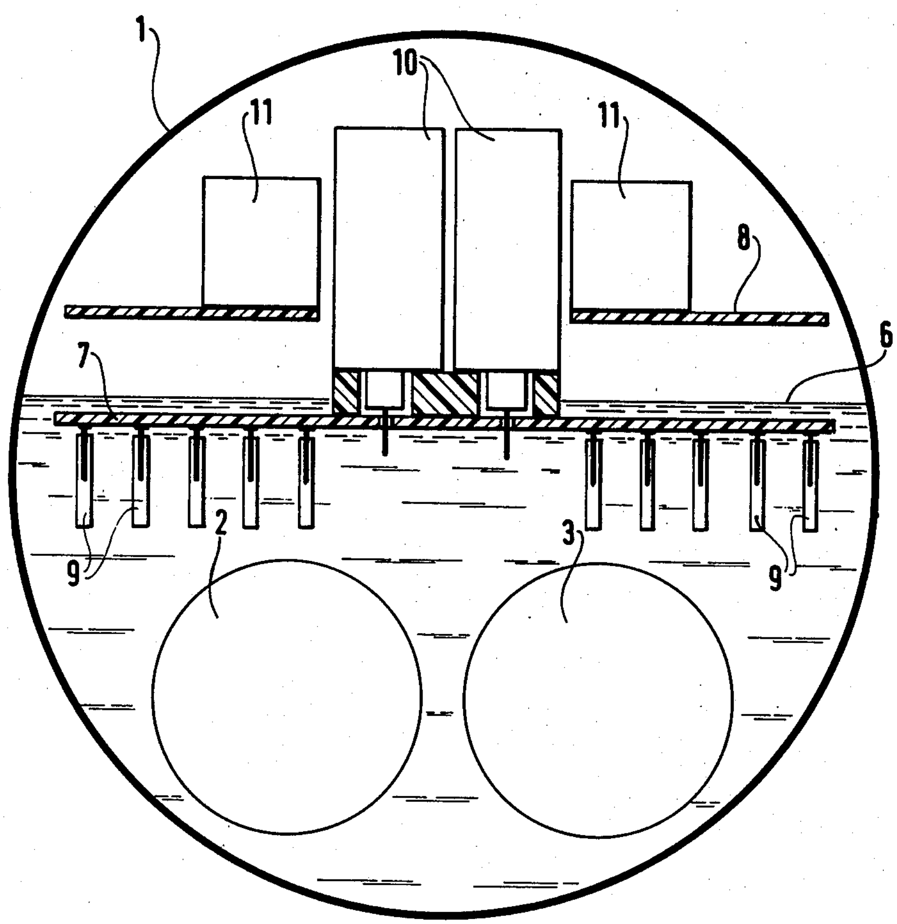
FIG. 1 is a diagrammatic transversal cross-section through an enclosure which contains several assemblies in accordance with the invention.
Figure 2:
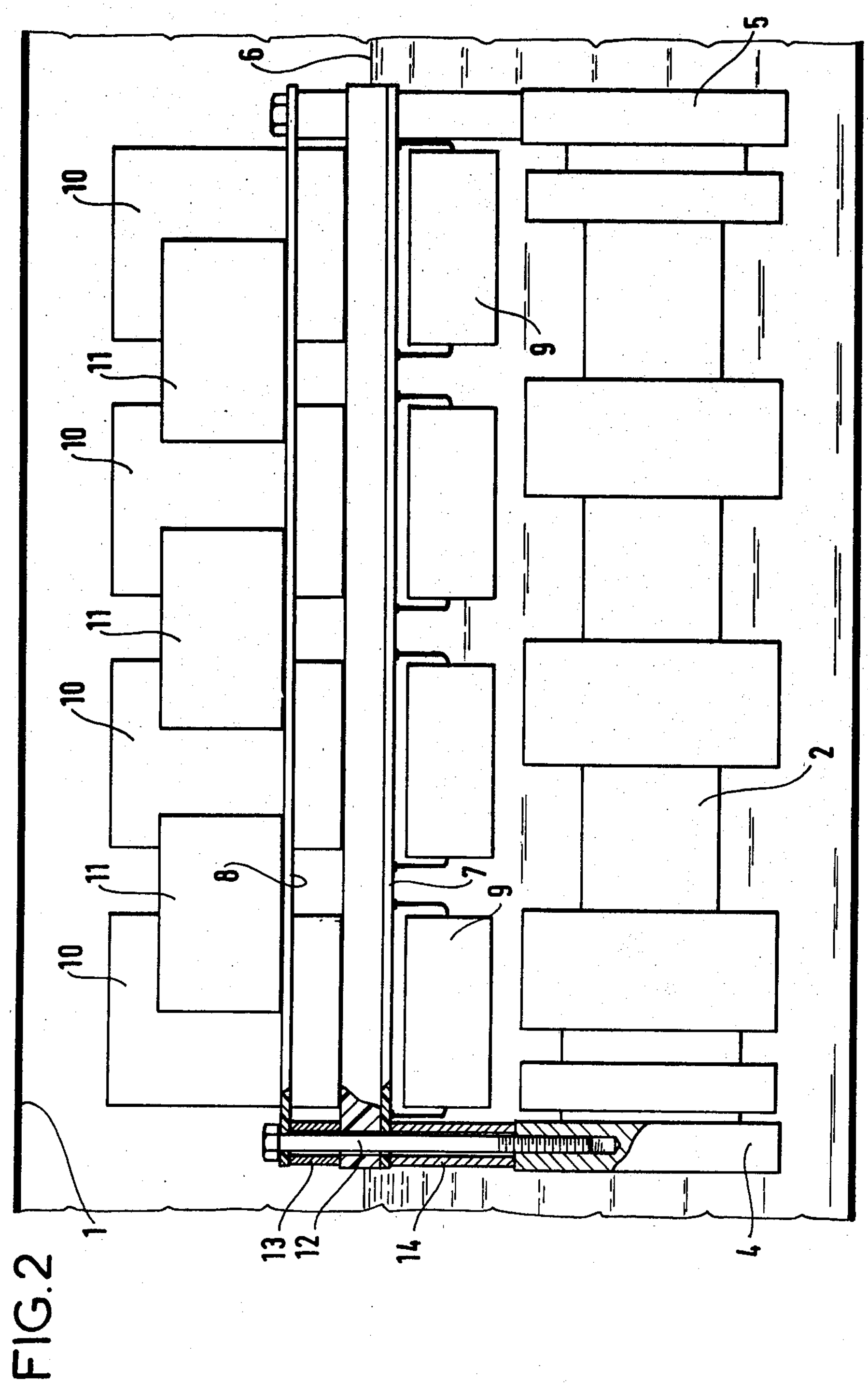
FIG. 2 is a partially cut away side view of the same device, to a larger scale.

In FIG. 1, a chamber 1 contains two columns 2 and 3 of semiconductors, e.g. power thyristors sandwiched and pressed between two end plates 4 and 5 (FIG. 2). A fluorinated hydrocarbon in the liquid state does not entirely fill the chamber 1 and thus leaves a space above its level 6 in which space said fluorinated hydrocarbon can change to the vapour state when columns 2 and 3 of the semiconductors heat up in use.

Two printed circuit boards 7 and 8 which also serve as supports for the auxiliary circuits of the thyristors are provided to form connections between these circuits. The protection circuits include a plurality of resistors such as 9, capacitors such as 10 (producing a time constant RC) and pulse transformers such as 11 whose function is to fire the triggers of the thyristors of columns 2 and 3.

The resistors 9 are immersed in fluorinated hydrocarbon whereas the capacitors 10, the pulse transformers 11 and one of the circuit boards—namely, the board 8—are disposed above the level 6.

It is observed that the plates 7 and 8 are disposed in planes parallel to the axes of the columns 2 and 3. Very short thyristor trigger control connections result therefrom since each of the transformers is level with the corresponding thyristor. Further, the length of the chamber 1 is appreciably reduced.

FIG. 2 shows the way in which the plates 7 and 8 are fixed. They are fitted end on onto the end plates 4 and 5 by means of tie rods such as tie rod 12 and of spacers 13 and 14.

The invention applies to energizing railway traction motors.

I claim:

1. In a sealed chamber, means mounting a set of power semiconductors equipped with firing transformers and resistors and capacitors forming protection circuits within said chamber, said mounting means comprising: end plates with said semiconductors being disposed in columns immersed in a cooling fluid and being installed between said end plates, supports, said transformers and said resistors and capacitors being disposed on said supports, printed circuits on said supports connecting the firing transformers, the resistors and capacitors, said printed circuits on said supports being disposed in at least one plane parallel to axes of said columns, the level of the cooling fluid being such that the transformers and capacitors are above the cooling fluid in the liquid state, and wherein said supports are made integral with said end plates by means of tie rods which pass through said supports, each of said tie rods being fitted into the end surface of one of said plates.

* * * * *